United States Patent
Lo et al.

(10) Patent No.: US 9,748,106 B2
(45) Date of Patent: Aug. 29, 2017

(54) METHOD FOR FABRICATING SEMICONDUCTOR PACKAGE

(71) Applicant: Micron Technology, Inc., Boise, ID (US)

(72) Inventors: Yi-Jen Lo, New Taipei (TW); Neng-Tai Shih, New Taipei (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/002,405

(22) Filed: Jan. 21, 2016

(65) Prior Publication Data

US 2017/0213740 A1    Jul. 27, 2017

(51) Int. Cl.
| | | |
|---|---|---|
| H01L 21/38 | (2006.01) |
| H01L 21/304 | (2006.01) |
| H01L 21/768 | (2006.01) |
| H01L 21/78 | (2006.01) |

(52) U.S. Cl.
CPC ...... *H01L 21/304* (2013.01); *H01L 21/76898* (2013.01); *H01L 21/78* (2013.01)

(58) Field of Classification Search
None
See application file for complete search history.

(56) References Cited

U.S. PATENT DOCUMENTS

| | | | | |
|---|---|---|---|---|
| 4,904,978 A * | 2/1990 | Barth | ............... | G01L 9/0055 338/4 |
| 5,563,084 A * | 10/1996 | Ramm | ............... | H01L 21/6835 148/DIG. 135 |
| 5,877,034 A * | 3/1999 | Ramm | ............... | H01L 21/84 257/E21.703 |
| 5,989,974 A * | 11/1999 | Yamada | ............ | H01L 21/76243 257/E21.563 |
| 6,091,130 A * | 7/2000 | Oyamatsu | ......... | H01L 21/31053 257/618 |
| 6,184,060 B1 * | 2/2001 | Siniaguine | ............ | H01L 21/441 257/690 |
| 6,322,903 B1 * | 11/2001 | Siniaguine | .......... | H01L 21/6835 257/E21.508 |
| 6,420,209 B1 * | 7/2002 | Siniaguine | ............ | H01L 21/441 257/E21.218 |
| 6,498,381 B2 * | 12/2002 | Halahan | ............ | H01L 21/76898 257/244 |
| 6,521,512 B2 * | 2/2003 | Vasquez | ............ | H01L 21/76898 257/E21.597 |
| 6,548,391 B1 * | 4/2003 | Ramm | ................ | H01L 21/6835 257/E21.597 |
| 6,639,303 B2 * | 10/2003 | Siniaguine | ............ | H01L 21/441 257/621 |

(Continued)

*Primary Examiner* — David E Graybill
(74) *Attorney, Agent, or Firm* — TraskBritt

(57) ABSTRACT

A method for fabricating a semiconductor package, the method includes forming at least one conductive via having a first end and a second end opposite the first end in a wafer, in which the wafer has a first surface and a second surface opposite the first surface, and the first end of the at least one conductive via is exposed of the first surface of the wafer; grinding the second surface of the wafer to form an inner portion and a ring portion surrounding the inner portion of the wafer, wherein the inner portion has a thinner thickness than that of the ring portion; and etching the inner portion to expose the second end of the at least one conductive via.

19 Claims, 7 Drawing Sheets

(56) References Cited

U.S. PATENT DOCUMENTS

| | | | | |
|---|---|---|---|---|
| 6,664,129 B2* | 12/2003 | Siniaguine | ............ | H01L 21/441 257/E21.218 |
| 6,693,361 B1* | 2/2004 | Siniaguine | .......... | H01L 21/6835 257/774 |
| 6,717,254 B2* | 4/2004 | Siniaguine | .......... | B81C 1/00301 257/618 |
| 6,730,540 B2* | 5/2004 | Siniaguine | ................ | G06F 1/10 257/723 |
| 6,740,582 B2* | 5/2004 | Siniaguine | ............ | H01L 21/441 257/E21.218 |
| 6,753,205 B2* | 6/2004 | Halahan | .................. | H01L 23/13 257/E21.597 |
| 6,787,916 B2* | 9/2004 | Halahan | .................. | H01L 23/13 257/680 |
| 6,844,241 B2* | 1/2005 | Halahan | ............ | H01L 21/76898 257/E21.597 |
| 6,882,030 B2* | 4/2005 | Siniaguine | ............ | H01L 21/441 257/621 |
| 6,897,148 B2* | 5/2005 | Halahan | ............ | H01L 21/76843 257/E21.597 |
| 6,958,285 B2* | 10/2005 | Siniaguine | .......... | B81C 1/00301 257/618 |
| 7,001,825 B2* | 2/2006 | Halahan | ............ | H01L 21/76898 257/E21.597 |
| 7,034,401 B2* | 4/2006 | Savastiouk | ............ | H01L 23/147 257/678 |
| 7,049,170 B2* | 5/2006 | Savastiouk | ............ | H01L 23/13 257/E23.008 |
| 7,060,601 B2* | 6/2006 | Savastiouk | ............ | H01L 23/147 257/E21.597 |
| 7,173,327 B2* | 2/2007 | Siniaguine | ................ | G06F 1/10 257/691 |
| 7,186,586 B2* | 3/2007 | Savastiouk | ............. | H01L 23/13 257/E21.511 |
| 7,521,360 B2* | 4/2009 | Halahan | ............ | H01L 21/76843 257/E21.597 |
| 7,851,272 B2* | 12/2010 | Cheng | .................... | G06Q 50/04 438/127 |
| 8,324,022 B2* | 12/2012 | Ramm | .............. | H01L 21/76898 257/741 |
| 8,409,881 B2* | 4/2013 | Cheng | .................... | G06Q 50/04 438/14 |
| 2002/0048955 A1* | 4/2002 | Vasquez | ............ | H01L 21/76898 438/689 |
| 2002/0063311 A1* | 5/2002 | Siniaguine | ............ | H01L 21/441 257/621 |
| 2002/0084513 A1* | 7/2002 | Siniaguine | ............ | H01L 21/441 257/621 |
| 2002/0113321 A1* | 8/2002 | Siniaguine | .......... | B81C 1/00301 257/782 |
| 2002/0115234 A1* | 8/2002 | Siniaguine | .......... | B81C 1/00301 438/107 |
| 2002/0115260 A1* | 8/2002 | Halahan | ............ | H01L 21/76898 438/386 |
| 2002/0115290 A1* | 8/2002 | Halahan | ............ | H01L 21/76898 438/667 |
| 2002/0127868 A1* | 9/2002 | Siniaguine | ............ | H01L 21/441 438/752 |
| 2003/0047798 A1* | 3/2003 | Halahan | .................. | H01L 23/13 257/685 |
| 2003/0085460 A1* | 5/2003 | Siniaguine | ............ | H01L 21/441 257/698 |
| 2003/0148552 A1* | 8/2003 | Halahan | .................. | H01L 23/13 438/106 |
| 2003/0197239 A1* | 10/2003 | Siniaguine | ................ | G06F 1/10 257/459 |
| 2003/0199123 A1* | 10/2003 | Siniaguine | ................ | G06F 1/10 438/118 |
| 2004/0203224 A1* | 10/2004 | Halahan | ............ | H01L 21/76843 438/637 |
| 2005/0051887 A1* | 3/2005 | Siniaguine | ................ | G06F 1/10 257/691 |
| 2005/0059217 A1* | 3/2005 | Morrow | ............ | H01L 21/76898 438/455 |
| 2005/0106845 A1* | 5/2005 | Halahan | ............ | H01L 21/76898 438/576 |
| 2005/0133930 A1* | 6/2005 | Savastisuk | ............ | H01L 23/147 257/774 |
| 2005/0136634 A1* | 6/2005 | Savastiouk | ............. | H01L 23/13 438/597 |
| 2005/0170647 A1* | 8/2005 | Halahan | ............ | H01L 21/76843 438/678 |
| 2005/0189636 A1* | 9/2005 | Savastiouk | ............ | H01L 23/147 257/678 |
| 2005/0207238 A1* | 9/2005 | Siniaguine | ................ | G06F 1/10 365/189.11 |
| 2005/0212127 A1* | 9/2005 | Savastiouk | ............. | H01L 23/13 257/734 |
| 2006/0035416 A1* | 2/2006 | Savastiouk | ............. | H01L 23/13 438/125 |
| 2007/0069377 A1* | 3/2007 | Siniaguine | ................ | G06F 1/10 257/734 |
| 2007/0128868 A1* | 6/2007 | Halahan | ............ | H01L 21/76843 438/687 |
| 2007/0231929 A1 | 10/2007 | Kajiyama et al. | | |
| 2008/0064187 A1 | 3/2008 | Brown | | |
| 2008/0296571 A1* | 12/2008 | Cheng | .................... | G06Q 50/04 257/48 |
| 2011/0049516 A1* | 3/2011 | Cheng | .................... | G06Q 50/04 257/48 |
| 2014/0070426 A1* | 3/2014 | Park | .................. | H01L 23/53238 257/774 |

* cited by examiner

METHOD FOR FABRICATING SEMICONDUCTOR PACKAGE

BACKGROUND

Technical Field

The present invention relates to a method for fabricating semiconductor packages.

Description of Related Art

Semiconductor industries continue to improve the integration density of various electronic components (e.g., transistors, diodes, resistors, capacitors, etc.) by continually reducing minimum feature size, which allows more components to be integrated into a given area. These smaller electronic components require smaller packages that utilize less area than packages of the past, in some applications.

Wafer level package (WLP) technique is an advanced packaging technology, by which a die is manufactured and tested on a wafer, and then the wafer is singulated by dicing for assembly in a surface-mount line. Because the WLP technique utilizes the whole wafer as one object, not utilizing a single chip or die, therefore, before performing a scribing process, packaging and testing has been accomplished; furthermore, WLP is such an advanced technique so that the process of wire bonding, die mounting and under-filling can be omitted. By utilizing WLP techniques, the cost and manufacturing time can be reduced, and the resulting structure of WLP can be equal to the die; therefore, this technique can meet the demands of miniaturization of electronic devices.

Though the advantages of the WLP technique are mentioned above, some issues still exist that influence the acceptance of WLP technique. For instance, one type of WLP technique that has been recently developed is Integrated Fan-Out Wafer-Level Packaging (InFO-WLP), in which the coefficient of thermal expansion CTE difference (mismatching) between the materials of a structure of WLP and the motherboard becomes another critical factor to the mechanical instability of the structure. Another type of WLP technique is chip-on-wafer-on-substrate (CoWoS), in which the wafer may be too thin to handle in the packaging process, and a temporary bonding process is needed, which brings additional problems such as residue adhesives or extra cost and manufacturing time.

SUMMARY

Embodiments of the present invention provide a method for fabricating a semiconductor package. In plural steps of the method, a ring portion is formed as a handle to support the thin wafer in the fabrication process. Little adhesive is used since the method adopts no temporary bonding techniques. Also, the coefficient of thermal expansion (CTE) difference (mismatching) has little influence since the method adopts no molding techniques.

According to one aspect of this invention, a method for fabricating a semiconductor package is provided. The method includes forming at least one conductive via having a first end and a second end opposite the first end in a wafer, in which the wafer has a first surface and a second surface opposite the first surface, and the first end of the conductive via is exposed of the first surface of the wafer; grinding the second surface of the wafer to form an inner portion and a ring portion surrounding the inner portion of the wafer, in which the inner portion has a thinner thickness than that of the ring portion; and etching the inner portion to expose the second end of the conductive via.

In one or more embodiments, the wafer includes a silicon substrate, a top silicon layer, and a buried dielectric layer. The silicon substrate is proximate the second surface of the wafer. The top silicon layer is proximate the first surface of the wafer. The buried dielectric layer is disposed between the silicon substrate and the top silicon layer. The conductive via extends through the top silicon layer and the buried dielectric layer before the grinding.

In one or more embodiments, the conductive via further extends to a portion of the silicon substrate before the grinding.

In one or more embodiments, the grinding the second surface of the wafer includes grinding the silicon substrate of the wafer.

In one or more embodiments, the etching the inner portion includes etching a remaining portion of the silicon substrate, in which the buried dielectric layer is an etch stop layer.

In one or more embodiments, the buried dielectric layer is made of silicon dioxide.

In one or more embodiments, the conductive via includes a conductive column and an insulation layer surrounding the conductive column, in which the method further includes etching the insulation layer of the conductive via after the etching the inner portion.

In one or more embodiments, the insulation layer of the conductive via has a thinner thickness than that of the buried dielectric layer of the wafer.

In one or more embodiments, the insulation layer and the buried dielectric layer are both made of silicon dioxide.

In one or more embodiments, the etching the inner portion of the wafer and the etching the insulation layer of the conductive via are performed by wet etching.

In one or more embodiments, the etching the inner portion of the wafer and the etching the insulation layer of the conductive via are performed with different wet etch solutions.

In one or more embodiments, the method further includes forming a patterned metal layer on the first surface of the wafer, in which the patterned metal layer is electrically connected to the conductive via.

In one or more embodiments, the method further includes forming a solder bump on the first surface of the wafer, in which the solder bump is electrically connected to the conductive via.

In one or more embodiments, the ground second surface is etched in the etching the inner portion, in which the method further includes forming at least one solder ball on the etched second surface of the wafer, in which the solder ball is electrically connected to the conductive via.

In one or more embodiments, the method further includes bonding at least one package component with the first surface of the wafer, in which the package component is electrically connected to the conductive via through the solder bump.

In one or more embodiments, the method further includes removing the ring portion from the wafer; and chipping the wafer into a plurality of micro-devices, in which each of the micro-devices comprises the package component and the solder ball.

In one or more embodiments, the method further includes bonding at least one of the micro-devices and a substrate through the solder ball.

In one or more embodiments, the conductive via is disposed corresponding to the inner portion of the wafer.

In one or more embodiments, the conductive via is made by laser drilling, etching, disposition, or combinations thereof.

In one or more embodiments, the thickness of the inner portion is in a range from 30 micrometers to 200 micrometers, and the thickness of the ring portion is in a range from 300 micrometers to 800 micrometers.

DETAILED DESCRIPTION

Figure 1:
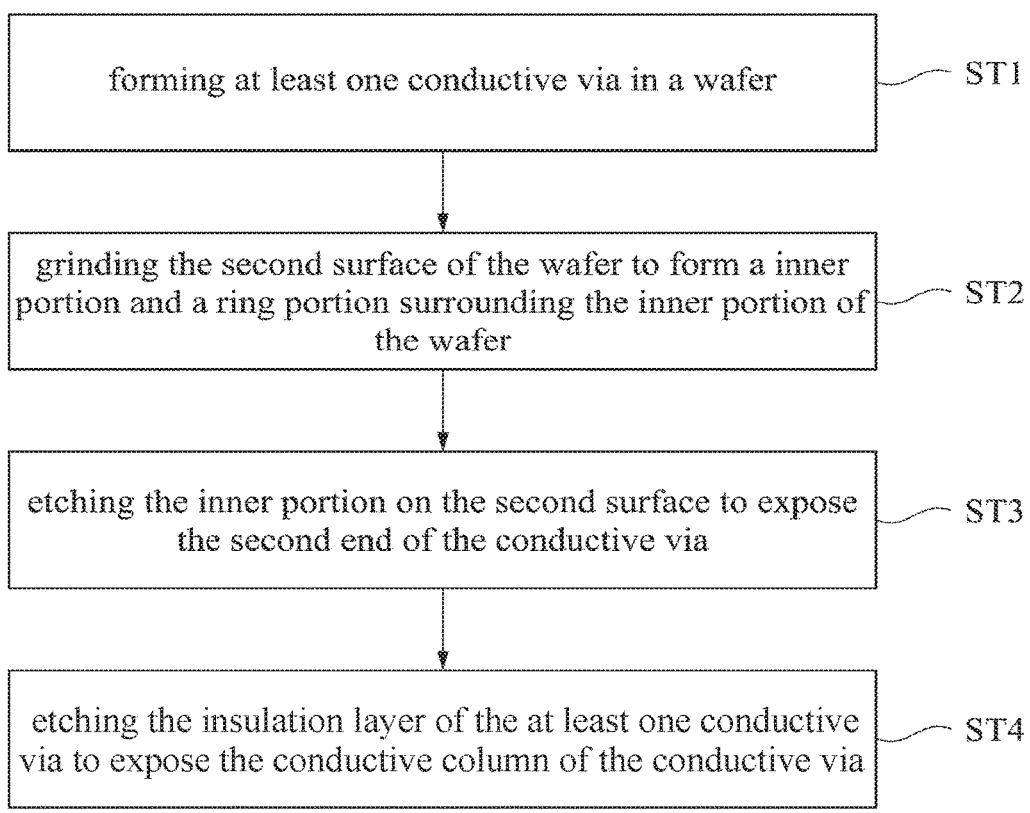
FIG. 1 is a flowchart of a method for fabricating a semiconductor package according to an embodiment of the invention.

Reference will now be made in detail to the present embodiments of the invention, examples of which are illustrated in the accompanying drawings. Wherever possible, the same reference numbers are used in the drawings and the description to refer to the same or like parts.

It will be understood that when an element is referred to as being "on" another element, it can be directly on the other element or intervening elements may be present therebetween. In contrast, when an element is referred to as being "directly on" another element, there are no intervening elements present.

FIG. 1 is a flowchart of a method for fabricating a semiconductor package according to an embodiment of the invention. The method is briefly described as steps ST1-ST4. In one or more embodiments, the method for fabricating a semiconductor package may be performed without the step ST4, and some steps may be added in the steps ST1-ST4 of FIG. 1.

FIG. 2A through FIG. 2L are schematic views of intermediate stages in the fabricating of a semiconductor package according to an embodiment of the invention. The fabrication processes of the semiconductor packages are illustrated in the following accompanied by FIGS. 2A-2L and the steps ST1-ST4 of FIG. 1.

Figure 2A:
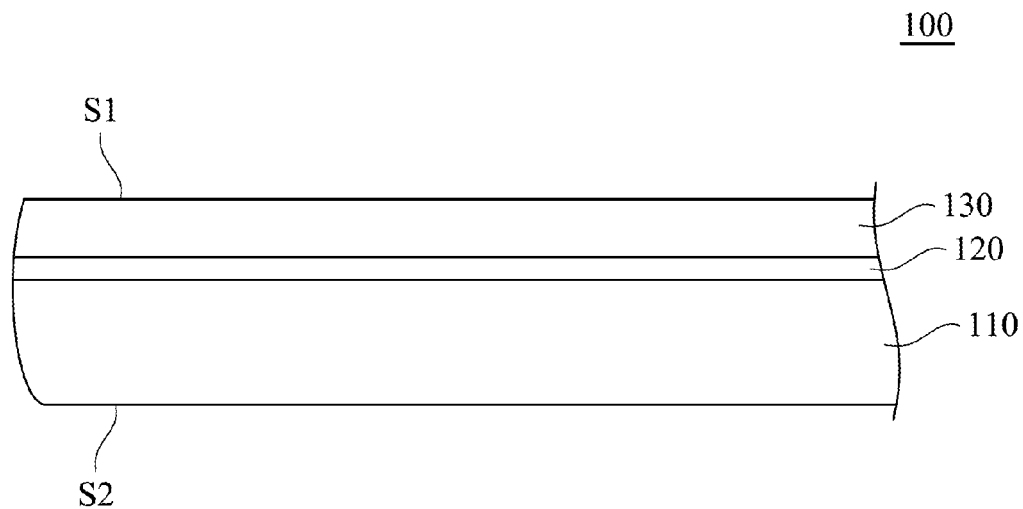
FIG. 2A through FIG. 2L are schematic views of intermediate stages in the fabricating of a semiconductor package according to an embodiment of the invention.

Reference is made to FIG. 2A. FIG. 2A is a cross-sectional view of a wafer 100. The wafer 100 may be a silicon-on-insulator (SOI) wafer, which includes a silicon substrate 110, a buried dielectric layer 120, and a top silicon layer 130. The top silicon layer 130 is proximate a first surface S1 of the wafer 100. The silicon substrate 110 is proximate a second surface S2 of the wafer 100, in which the first surface S1 is opposite the second surface S2. The buried dielectric layer 120 is disposed between the silicon substrate 110 and the top silicon layer 130. In one or more embodiments, the buried dielectric layer 120 is made of silicon dioxide, and the silicon substrate 110 and the top silicon layer 130 are made of silicon.

Figure 2B:
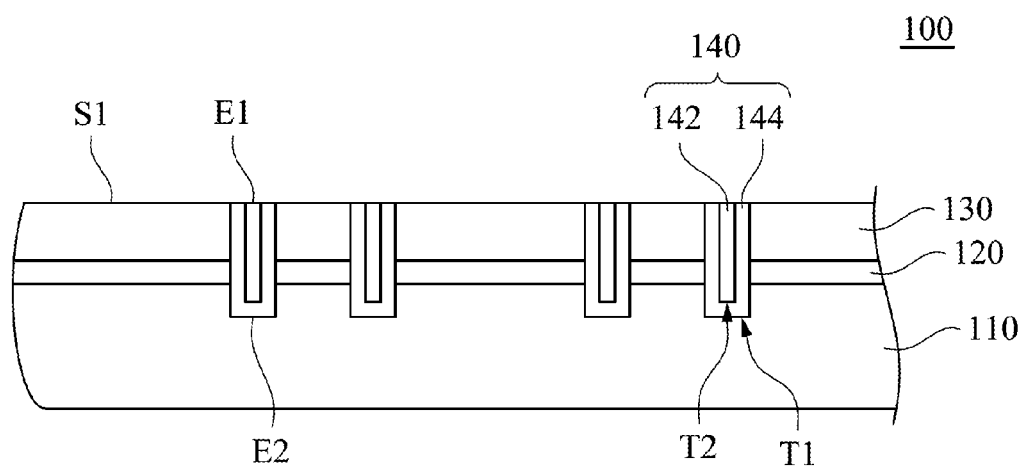

Reference is made to both FIG. 1 and FIG. 2B. At step ST1, at least one conductive via 140 is formed in the wafer 100. In one or more embodiments, the conductive via 140 has a first end E1 and a second end E2 opposite the first end E1. The first end E1 of the conductive via 140 is exposed on the first surface S1 of the wafer 100. The conductive via 140 extends through the top silicon layer 130 and the buried dielectric layer 120. In one or more embodiments, the conductive via 140 further extends to a portion of the silicon substrate 110.

In one or more embodiments, the position of the conductive via 140 is designed based on the structures of semiconductor packages. Since the wafer 100 is later chipped to form the plurality of semiconductor packages and a periphery of the wafer 100 is removed, the conductive via 140 may be disposed uniformly in wafer 100, except the periphery of the wafer 100. To be specific, the conductive via 140 is disposed corresponding to an inner portion IP (later shown in FIG. 2E) of the wafer 100.

In practice, in the formation of the conductive via 140, a first through hole T1 may be formed in the wafer 100 first. The first through hole T1 may penetrate the top silicon layer 130, the buried dielectric layer 120, and a portion of the silicon substrate 110. Next, the first through hole T1 may be filled with dielectric material. Then, a second through hole T2 may be formed in the dielectric material. The second through hole T2 may have a shorter depth and diameter than that of the first through hole T1. Finally, a conductive material may be filled in the second through hole T2. As a result, the conductive via 140 includes a conductive column 142 and an insulation layer 144 covering and surrounding the conductive column 142. Laser drilling, etching, disposition, or combinations thereof may be implemented in the formation of the conductive via 140. Also, additional steps, such as a chemical mechanical planarization process may also be performed in the formation of the conductive via 140.

In one or more embodiments, the conductive column 142 is made of a conductive material, such as titanium, molybdenum, chromium, iridium, aluminum, copper, silver, gold, or any combination or alloy thereof. The insulation layer 144 is made of dielectric material, such as silicon nitride, silicon oxide, silicon oxynitride, or any combination thereof.

Figure 2C:
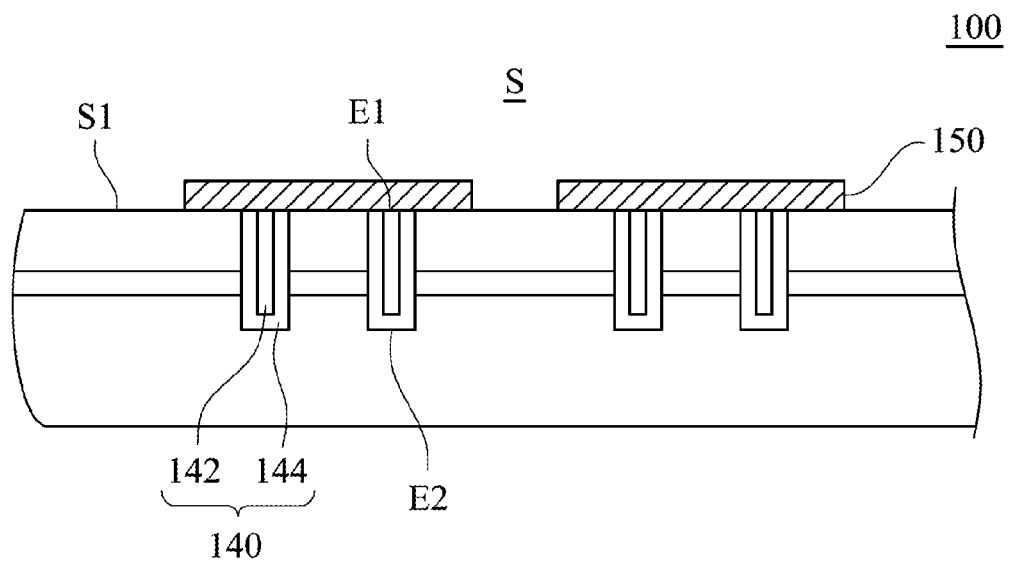

Reference is made to both FIG. 1 and FIG. 2C. A first patterned metal layer 150 is formed on the first surface S1 of the wafer 100. The first patterned metal layer 150 is connected to the first end E1 of the conductive via 140, and therefore electrically connected to the conductive column 142.

In one or more embodiments, the first patterned metal layer 150 is made of conductive material, such as copper, titanium, silver, etc. Plural processes, such as lithography, etching, and other known techniques, can form the first patterned metal layer 150.

Figure 2D:
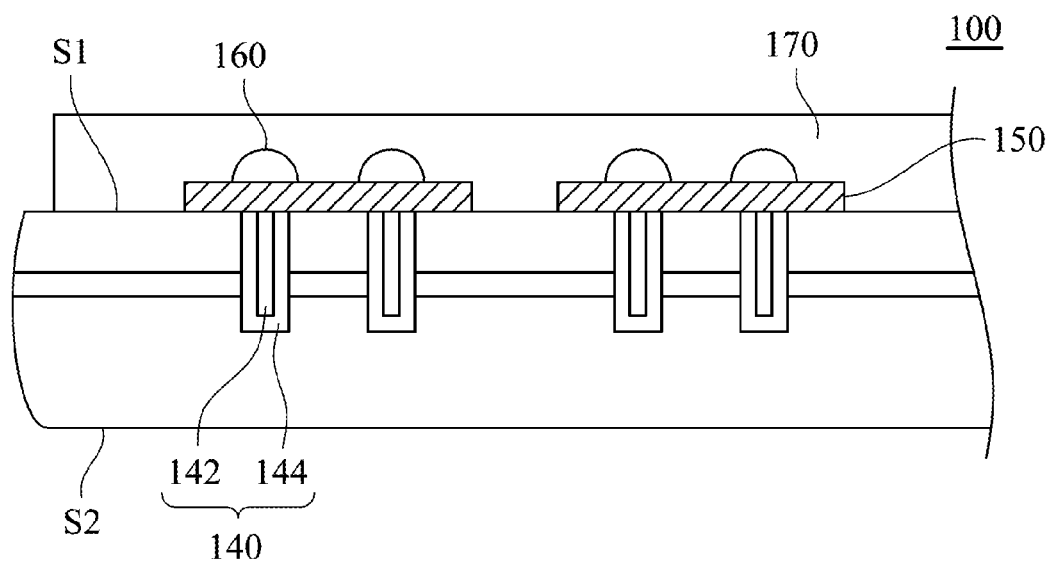
Figure 2E:
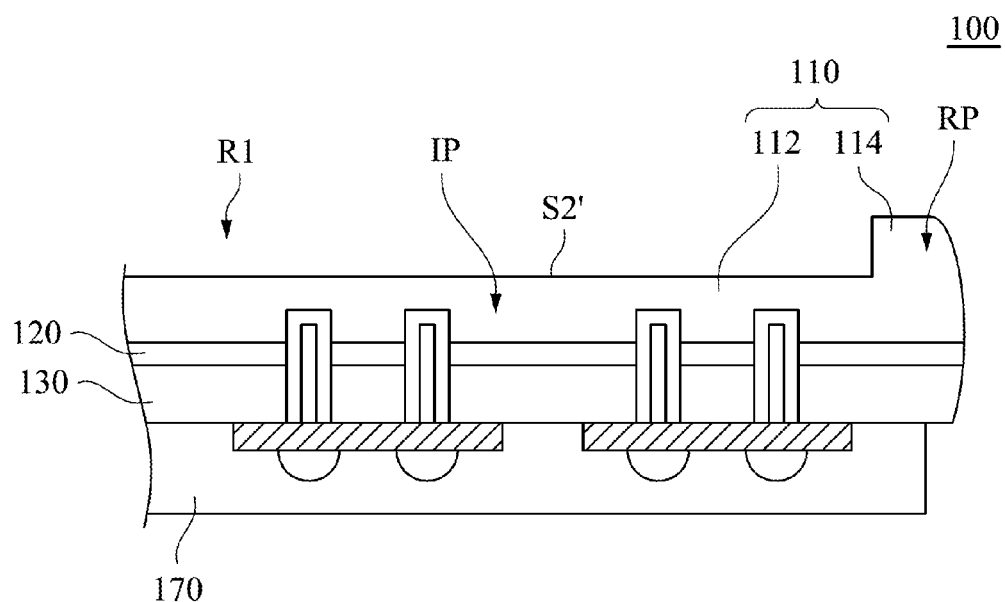
Figure 2F:
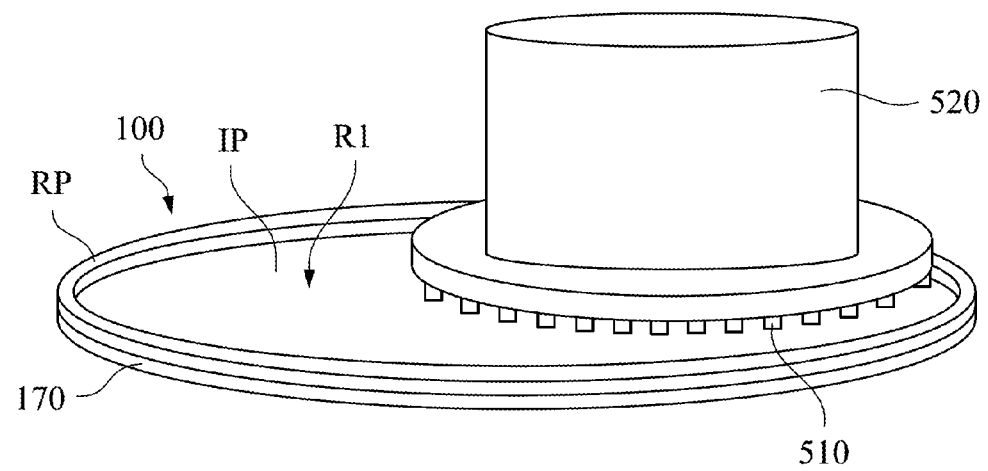

Reference is made to both FIG. 1 and FIG. 2D. At least one solder bump 160 is formed on the first surface S1 of the wafer 100. To be specific, in some embodiments, the solder bump 160 is formed on the first patterned metal layer 150. Herein, the solder bump 160 may be, or may not be, formed on the top surfaces of the conductive via 140. In one embodiment, the solder bump 160 can be indirectly electrically connected to the conductive column 142 through the first patterned metal layer 150. In another embodiment, the solder bump 160 can be directly electrically connected to the conductive column 142.

In one or more embodiments, the solder bump 160 may be made of solder that is a fusible metal alloy used to join together metal workpieces and having a melting point below that of the workpiece(s). For example, the solder bump 160 may be made of copper, nickel, lead-free solder, or tin-lead alloy with or without silver.

In an embodiment, a protection tape 170 may then be formed on the first surface S1 for temporarily covering and protecting the first patterned metal layer 150 and the solder bump 160 from being scratched or destroyed in the following manufacturing process. The protection tape 170 may be made of polymeric films, such as polyethylene (PE) or ethylene-vinyl acetate (EVA). In some embodiments, the protection tape 170 can be omitted, and the first patterned metal layer 150 and the solder bump 160 are left exposed in the following manufacturing process.

Then, the wafer 100 in FIG. 2D is flipped upside down, with the second surface S2 facing upward. Reference is made to both FIG. 1, FIG. 2E and FIG. 2F. At step ST2, the second surface S2 of the wafer 100 in FIG. 2D is ground to form an inner portion IP and a ring portion RP surrounding the inner portion IP of the wafer 100. The inner portion IP has a thinner thickness than that of the ring portion RP. Therefore, a recess R1 is formed in the wafer 100 with the inner portion IP serving as a bottom and the ring portion RP serving as a wall of the recess R1.

To be specific, in the grinding process, the buried dielectric layer 120 and the top silicon layer 130 remain the same, a portion of the silicon substrate 110 of the wafer 100 is ground and removed, and a inner remaining portion 112 and a ring remaining portion 114 of the silicon substrate 110 are left. The ring remaining portion 114 surrounds the inner remaining portion 112 and has a thicker thickness than that of the inner remaining portion 112. As a result, the inner remaining portion 112 of the silicon substrate 110 and a portion of the buried dielectric layer 120 and the top silicon layer 130 form the inner portion IP, and the ring remaining portion 114 of the silicon substrate 110 and the other portion of the buried dielectric layer 120 and the top silicon layer 130 form the ring portion RP.

Herein, in practice, a grindstone 510 having a rough surface and a size smaller than the wafer 100 may be utilized. The grindstone 510 is firmly fixed to a lower surface of a grinding wheel 520, which can move up and down and rotate. In this way, when the grinding wheel 520 descends while rotating, the grindstone 510 comes into contact with the second surface S2 of the semiconductor wafer 100 to perform grinding. In some embodiments, instead of the grindstone 510, a blade may be utilized to form the recess R1.

In one or more embodiments, the thickness of the inner portion IP is in a range from 30 micrometers to 200 micrometers, and the thickness of the ring portion RP is in a range from 300 micrometers to 800 micrometers.

In this way, the inner portion IP of the wafer 100 has a thin thickness that is suitable for small packages. Though the inner portion IP of the wafer 100 with the thin thickness may be easily broken and hard to grip in the following manufacturing process, the ring portion RP may support the inner portion IP and offer a handle of the wafer 100. The ring portion RP enables the thin wafer 100 to be processed in the following manufacturing process without temporarily adhering the wafer 100 to any supporting board. Therefore, the fabrication of the semiconductor packages may leave no adhesive.

Herein, after the grinding process, the wafer 100 may have a rough ground second surface S2'. While the ring portion RP puts obstacles in the way of the chemical mechanical planarization process, an etch process may be performed for flattening the second surface S2' of the wafer 100.

Figure 2G:
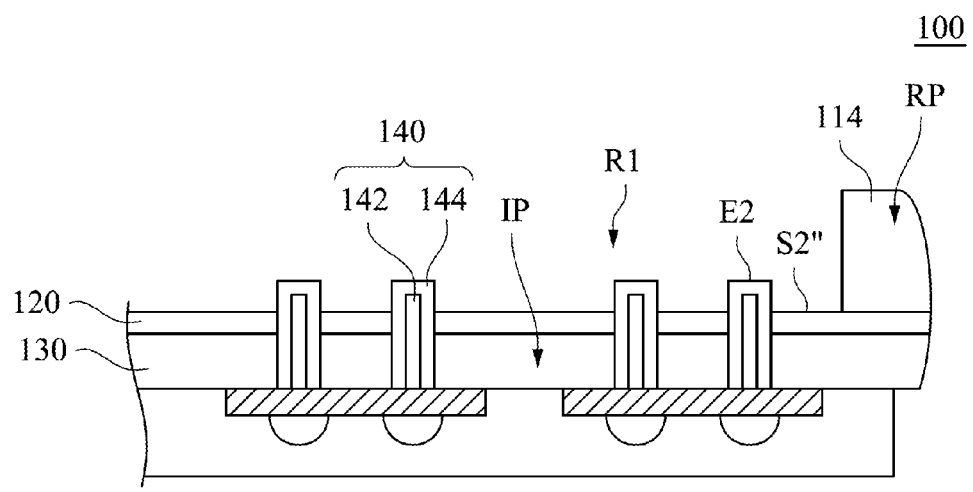

Reference is made to both FIG. 1 and FIG. 2G. At step ST3, the inner portion IP (referring to FIG. 2E) is etched to expose the second end E2 of the conductive via 140. To be specific, the ground second surface S2' is etched. In this embodiment, the inner remaining portion 112 (referring to FIG. 2E) of the silicon substrate 110 is etched and removed, and the buried dielectric layer 120 and the insulation layer 144 of the conductive via 140 serve as etch stop layers, which prevents damage to the top silicon layer 130 and the conductive column 142. As a result, after the etch process, and the wafer 100 may have a flat second surface S2", and the second end E2 of the conductive via 140 is exposed of the second surface S2".

In this embodiment, a wet etching process is performed. An etch solution for silicon etching, such as KOH (potassium hydroxide), TMAH (tetramethyl ammonium hydroxide), or EDP (ethylenediamine pyrocatechol) can be injected into the recess R1 for etching the silicon substrate 110 (referring to FIG. 2E). In some embodiments, the insulation layer 144 and the buried dielectric layer 120 are made of silicon dioxide, silicon nitride, or any combinations thereof, which can stand the above etching solution for silicon etching.

Figure 2H:
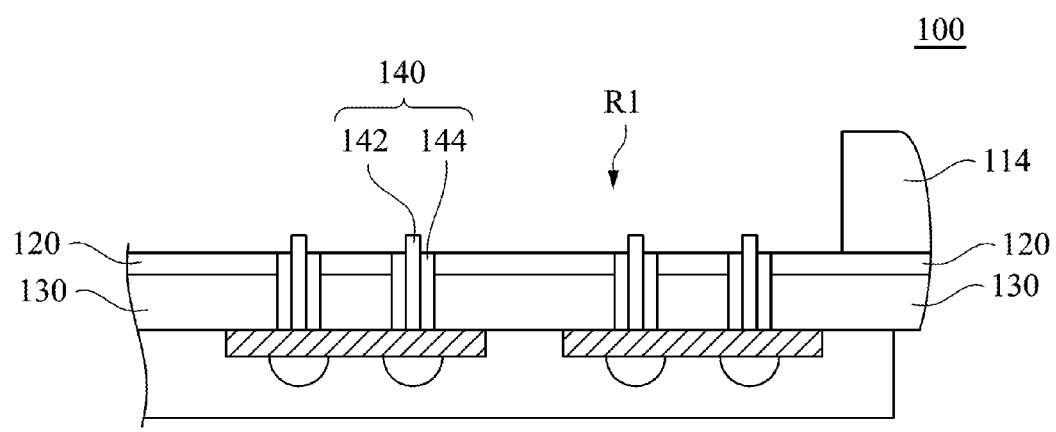

Reference is made to both FIG. 1 and FIG. 2H. At step ST4, the insulation layer 144 of the conductive via 140 is etched. To be specific, a top portion of the conductive via 140 is removed to expose the conductive column 142. In this embodiment, a wet etching process is adopted, and an etch solution for etching the insulation layer 144 can be injected into the recess R1 for removing the insulation layer 144.

In an embodiment, the insulation layer 144 of the conductive via 140 and the buried dielectric layer 120 are made of the same material, such as silicon dioxide. The etch solution may be made of ammonium fluoride or hydrofluoric acid. The insulation layer 144 and the buried dielectric layer 120 may be etched at the same time. Herein, the insulation layer 144 is designed to have a thinner thickness than that of the buried dielectric layer 120, so that when the insulation layer 144 is etched to expose the conductive column 142, a portion of the buried dielectric layer 120 may remain. However, it should not limit the scope of the present invention, in some embodiments, the insulation layer 144 of the conductive via 140 and the buried dielectric layer 120 may be made of different materials.

Figure 2I:
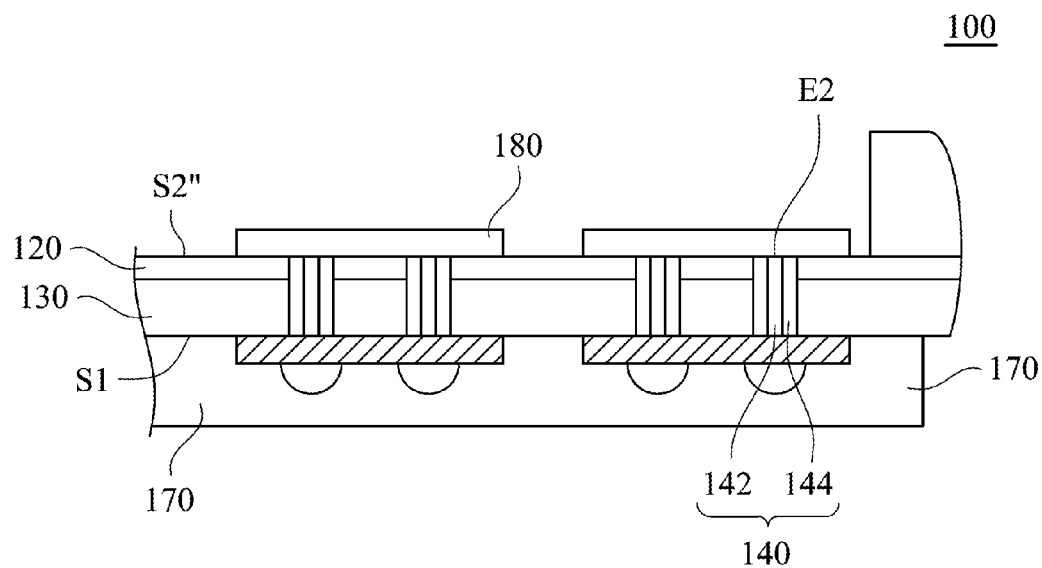

Reference is made to FIG. 2I. In one or more embodiments, a second patterned metal layer 180 can be formed on the buried dielectric layer 120. In this way, the second patterned metal layer 180 is electrically connected to the conductive via 140, specifically to the conductive column 142.

In one or more embodiments, the second patterned metal layer 180 is made of conductive material, such as copper, titanium, silver, etc. Plural processes, such as lithography, etching, and other known techniques, can form the second patterned metal layer 180.

Figure 2J:
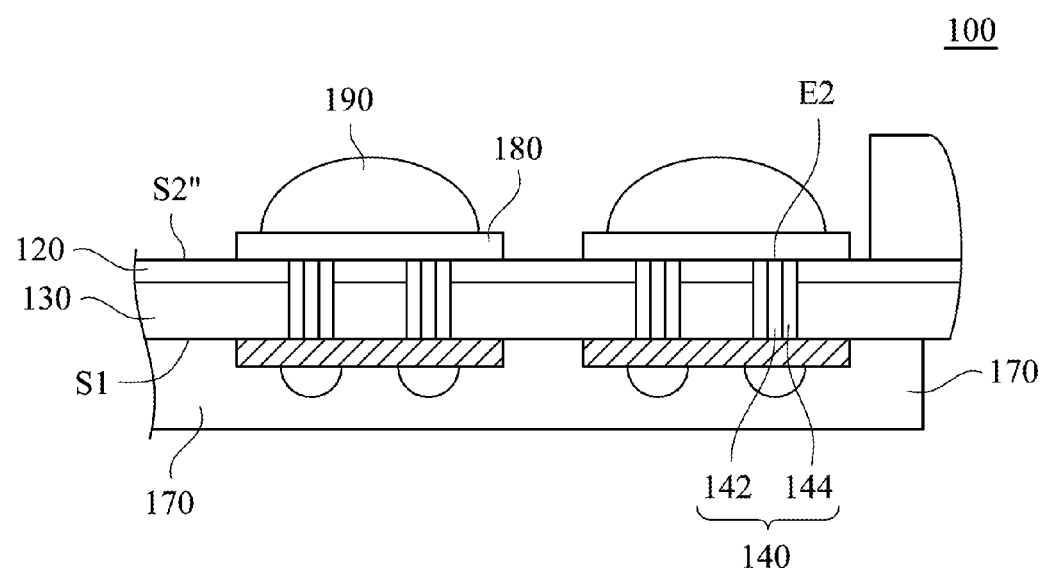

Reference is made to FIG. 2J. At least one solder ball 190 is formed on the etched second surface S2". In this embodiment, the solder ball 190 is formed on second patterned metal layer 180. The solder ball 190 is electrically connected to the conductive via 140 through the second patterned metal layer 180.

In one or more embodiments, the solder ball 190 may be made of solder that is a fusible metal alloy used to join together metal workpieces and having a melting point below that of the workpiece(s). For example, the solder ball 190 may be made of lead-free solder, or tin-lead alloy with or without silver.

Figure 2K:
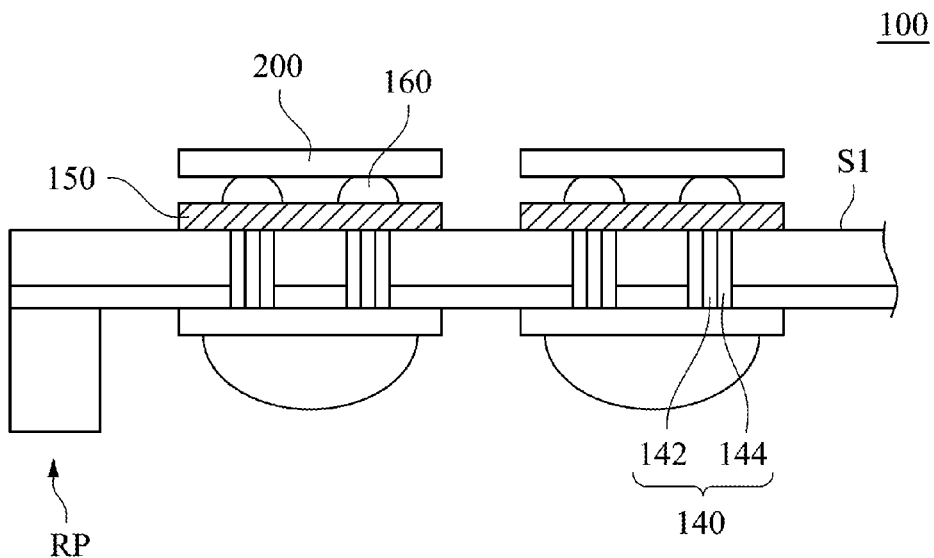

Reference is made to FIG. 2K. The protection tape 170 in FIG. 2J is removed from the first surface S1 of the wafer 100. Then, at least one package component 200 is bonded with the first patterned metal layer 150 through the solder bump 160.

The solder bump 160 accordingly electrically couples the circuits in the package component 200 to the first patterned metal layer 150 of the wafer 100. The package component 200 may be device dies comprising logic circuits, memory circuits, or the like. Alternatively, the package component 200 may include packages including dies bonded to the respective interposers, package substrates, and/or the like.

In this way, a "chip-on-wafer" is built with the ring portion RP serves as a handle of the wafer 100 in the manufacturing process.

In one embodiment, plural package components 200 may be arrayed on a supporting substrate. The wafer 100 may be placed on the supporting substrate with the first surface S1 facing the package components 200, and a soldering process may be performed for bonding the wafer 100 and the package components 200.

In another embodiment, the wafer 100 in FIG. 2J can be flipped upside down, then a plurality of package components 200 may be placed on the wafer 100 directly, and a soldering process may be performed for bonding the wafer 100 and the package components 200.

Figure 2L:
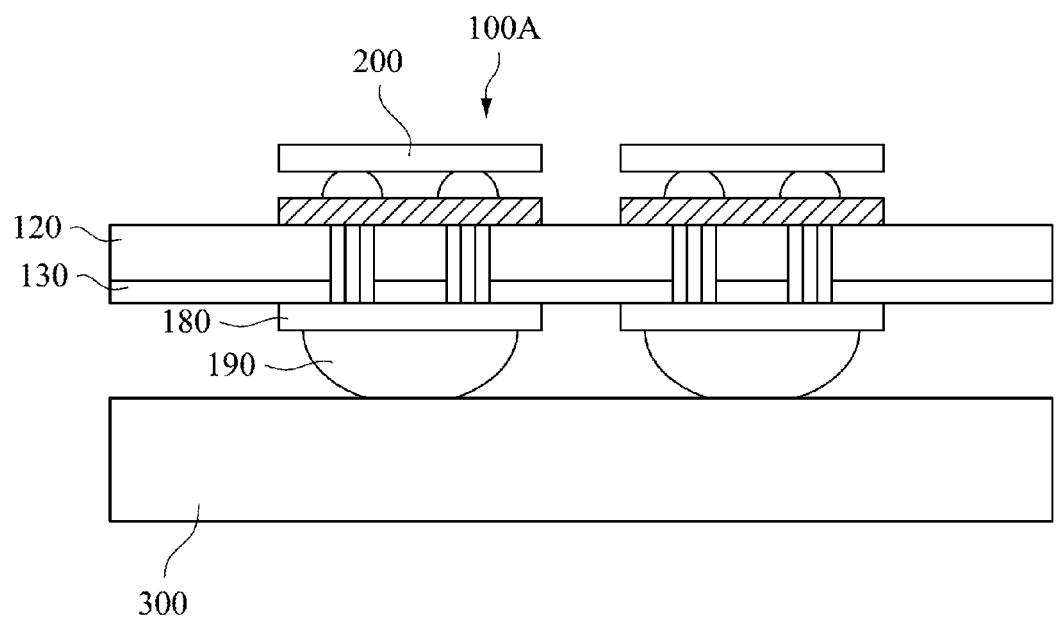

Reference is made to FIG. 2L. The ring portion RP in FIG. 2K is removed from the wafer 100; the wafer 100 is chipped into plural micro-devices 100A, in which each of the micro-devices 100A includes at least one package component 200 and at least one solder ball 190. Then, one of the micro-devices 100A may be bonded with a substrate 300 through the solder ball 190. In this way, a structure of "chip-on-wafer-on-substrate" is formed.

In one or more embodiments, the substrate 300 may be an organic substrate, such as a printed circuit board (PCB) or a flexible printed circuit board (FPCB), but it should not limit the scope of the present invention. In some embodiments, the substrate 300 may also be an inorganic substrate, such as a glass substrate.

Embodiments of the present invention provide a method for fabricating a semiconductor package. In plural steps of the method, a ring portion is formed as a handle to support the thin wafer in the fabrication process. Therefore, little adhesive is used since the method adopts no temporary bonding techniques. Also, the coefficient of thermal expansion (CTE) difference (mismatching) has little influence since the method adopts no molding techniques.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the appended claims.

What is claimed is:

1. A method for fabricating a semiconductor package, comprising:
    forming at least one conductive via in a wafer, wherein the wafer comprises a silicon substrate, a top silicon layer, and a buried dielectric layer disposed between the silicon substrate and the top silicon layer, wherein the top silicon layer is in contact with the buried dielectric layer, and the at least one conductive via extends through the top silicon layer and the buried dielectric layer;
    grinding a surface of the silicon substrate of the wafer opposite the buried dielectric layer to form an inner portion and a ring portion surrounding the inner portion of the wafer, wherein the inner portion has a thinner thickness than a thickness of the ring portion; and
    etching the inner portion to expose an end of the at least one conductive via.

2. The method of claim 1, wherein the at least one conductive via further extends to a portion of the silicon substrate before the grinding.

3. The method of claim 1, wherein the etching the inner portion comprises:
    etching a remaining portion of the silicon substrate, wherein the buried dielectric layer is an etch stop layer.

4. The method of claim 1, wherein the buried dielectric layer is made of silicon dioxide.

5. The method of claim 1, wherein the at least one conductive via comprises a conductive column and an insulation layer surrounding the conductive column, wherein the method further comprises:
    etching the insulation layer of the at least one conductive via after the etching the inner portion.

6. The method of claim 5, wherein the insulation layer of the at least one conductive via has a thinner thickness than a thickness of the buried dielectric layer of the wafer.

7. The method of claim 5, wherein the insulation layer and the buried dielectric layer are both made of silicon dioxide.

8. The method of claim 5, wherein the etching the inner portion of the wafer and the etching the insulation layer of the at least one conductive via are performed by wet etching.

9. The method of claim 5, wherein the etching the inner portion of the wafer is performed with a first etch solution, and the etching the insulation layer of the at least one conductive via is performed with a second etch solution, and the first etch solution is different from the second etch solution.

10. The method of claim 1, further comprising:
    forming a patterned metal layer on a surface of the top silicon layer opposite the buried dielectric layer, wherein the patterned metal layer is electrically connected to the at least one conductive via.

11. The method of claim 1, further comprising:
    forming a solder bump on a surface of the top silicon layer opposite the buried dielectric layer, wherein the solder bump is electrically connected to the at least one conductive via.

12. The method of claim 11, wherein the ground surface of the silicon substrate is etched in the etching the inner portion, and the method further comprises:
    forming at least one solder ball on an etched surface of the inner portion, wherein the solder ball is electrically connected to the at least one conductive via.

13. The method of claim 12, further comprising:
    bonding at least one package component with the surface of the top silicon layer, wherein the package component is electrically connected to the at least one conductive via through the solder bump.

14. The method of claim 13, further comprising:
    removing the ring portion from the wafer; and
    chipping the wafer into a plurality of micro-devices, wherein each of the micro-devices comprises the package component and the solder ball.

15. The method of claim 14, further comprising:
    bonding at least one of the micro-devices and a substrate through the solder ball.

16. The method of claim 1, wherein the at least one conductive via is disposed in the inner portion of the wafer.

17. The method of claim 1, wherein the at least one conductive via is made by laser drilling, etching, deposition, or combinations thereof.

18. The method of claim 1, wherein the thickness of the inner portion is in a range from 30 micrometers to 200 micrometers, and the thickness of the ring portion is in a range from 300 micrometers to 800 micrometers.

19. The method of claim 1, wherein the wafer is a silicon-on-insulator (SOI) wafer.

* * * * *

UNITED STATES PATENT AND TRADEMARK OFFICE
CERTIFICATE OF CORRECTION

PATENT NO. : 9,748,106 B2  
APPLICATION NO. : 15/002405  
DATED : August 29, 2017  
INVENTOR(S) : Yi-Jen Lo and Neng-Tai Shih Page 1 of 1

It is certified that error appears in the above-identified patent and that said Letters Patent is hereby corrected as shown below:

In the Specification

| | | |
|---|---|---|
| Column 1, | Line 4, | change "BACKGROUND" to --TECHNICAL FIELD-- |
| Column 1, | Line 6, | delete subheading "Technical Field" |
| Column 1, | Line 9, | prior to subtitle "Description of Related Art" insert title --BACKGROUND-- |
| Column 1, | Line 46, | change "SUMMARY" to --BRIEF SUMMARY-- |
| Column 5, | Line 14, | change "and a inner" to --and an inner-- |
| Column 6, | Line 6, | change "(tetramethyl ammonium" to --(tetramethylammonium-- |

Signed and Sealed this  
Thirty-first Day of October, 2017

Joseph Matal  
*Performing the Functions and Duties of the*  
*Under Secretary of Commerce for Intellectual Property and*  
*Director of the United States Patent and Trademark Office*